United States Patent
Takahashi

(10) Patent No.: US 7,803,209 B2
(45) Date of Patent: Sep. 28, 2010

(54) SB-TE ALLOY SINTERED COMPACT SPUTTERING TARGET

(75) Inventor: Hideyuki Takahashi, Ibaraki (JP)

(73) Assignee: Nippon Mining & Metals Co., Ltd, Tokyo (JP)

( * ) Notice: Subject to any disclaimer, the term of this patent is extended or adjusted under 35 U.S.C. 154(b) by 223 days.

(21) Appl. No.: 11/719,967

(22) PCT Filed: Sep. 30, 2005

(86) PCT No.: PCT/JP2005/018113

§ 371 (c)(1),
(2), (4) Date: May 23, 2007

(87) PCT Pub. No.: WO2006/059429

PCT Pub. Date: Jun. 8, 2006

(65) Prior Publication Data

US 2007/0297938 A1 Dec. 27, 2007

(30) Foreign Application Priority Data

Nov. 30, 2004 (JP) ............................. 2004-347602

(51) Int. Cl.
*B22F 3/00* (2006.01)
*C23C 14/34* (2006.01)
(52) U.S. Cl. .................................. 75/228; 204/298.13
(58) Field of Classification Search .................. 75/228; 204/298.13
See application file for complete search history.

(56) References Cited

U.S. PATENT DOCUMENTS

| | | | | |
|---|---|---|---|---|
| 6,153,315 | A * | 11/2000 | Yamakoshi et al. | 428/687 |
| 6,319,368 | B1 * | 11/2001 | Ide et al. | 204/192.26 |
| 7,156,964 | B2 | 1/2007 | Yahagi et al. | |
| 7,484,546 | B2 | 2/2009 | Yahagi et al. | |
| 2005/0031484 | A1 | 2/2005 | Nonaka et al. | |
| 2005/0115829 | A1 * | 6/2005 | Yahagi et al. | 204/298.13 |
| 2007/0062808 | A1 | 3/2007 | Yahagi et al. | |
| 2009/0071821 | A1 | 3/2009 | Takahashi | |
| 2009/0301872 | A1 | 12/2009 | Yahagi et al. | |
| 2010/0025236 | A1 | 2/2010 | Takahashi | |

FOREIGN PATENT DOCUMENTS

| | | |
|---|---|---|
| EP | 1394284 A1 | 3/2004 |
| JP | 03-162570 A | 7/1991 |
| JP | 2000-313955 A | 11/2000 |
| JP | 2001-059170 A | 3/2001 |
| JP | 2001-342505 A | 12/2001 |
| JP | 2001-342559 A | 12/2001 |
| JP | 2004-162109 A | 6/2004 |
| WO | 00/40769 A1 | 7/2000 |
| WO | 03/071531 A1 | 8/2003 |

OTHER PUBLICATIONS

ESP@CENET Database, English Abstract of JP 2000-265262, Sep. 26, 2000.
ESP@CENET Database, English Abstract of JP 2001-098366, Apr. 10, 2001.
ESP@CENET Database, English Abstract of JP 2001-123266, May 8, 2001.
ESP@CENET Database, English Abstract of JP 10-081962, Mar. 31, 1998.
ESP@CENET Database, English Abstract of JP 2001-123267, May 8, 2001.
ESP@CENET Database, English Abstract of JP 2000-129316, May 9, 2000.
ESP@CENET Database, English Abstract of JP 2000-169960, Jun. 20, 2000.

* cited by examiner

*Primary Examiner*—Roy King
*Assistant Examiner*—Ngoclan T Mai
(74) *Attorney, Agent, or Firm*—Howson and Howson LLP

(57) ABSTRACT

Provided is an Sb—Te alloy sintered compact sputtering target having at least Sb or Te as its primary component, wherein surface roughness Ra is 0.4 μm or less, purity excluding gas components is 4N or more, content of gas components as impurities is 1500 ppm or less, and average crystal grain size is 50 μm or less. With this Sb—Te alloy sintered compact sputtering target, the density of defects having a maximum length of 10 μm or greater arising in a surface finish by machining is 80 or less in an 800 μm square. Thus, the Sb—Te alloy sputtering target structure can be uniformalized and refined, generation of cracks in the sintered target can be inhibited, and generation of arcing during sputtering can be inhibited. Further, surface ruggedness caused by sputter erosion can be reduced in order to obtain a high quality Sb—Te alloy sputtering target.

12 Claims, 2 Drawing Sheets

SB-TE ALLOY SINTERED COMPACT SPUTTERING TARGET

BACKGROUND OF THE INVENTION

The present invention relates to an Sb—Te alloy sintered compact sputtering target capable of effectively inhibiting the generation of particles.

In recent years, a thin film formed from an Sb—Te material as the phase-change recording material is being used as a medium for recording information using so-called phase transformation. As a method of forming a thin film formed from an Sb—Te alloy material, a generally employed means known as a physical deposition method such as a vacuum deposition method or a sputtering method is used. In particular, a magnetron sputtering method is often used for forming such a thin film from the perspective of operability and coating stability.

Formation of a film according to the sputtering method is conducted by physically colliding positive ions such as Ar ions to a target disposed on a negative electrode, discharging the material configuring the target with such collision energy, and laminating a film having approximately the same composition as the target material on a substrate on the opposite positive electrode side.

Coating according to the sputtering method is characterized in that it is able to form thin films of angstrom units and thick films of several ten μm with a stable deposition speed by adjusting the treating time and power supply.

A particular problem when forming a film formed with an Sb—Te alloy material for a phase-change recording film is the generation of particles during sputtering, generation of nodules (protrusions) that causes abnormal electrical discharge (micro arcing) or cluster-shaped thin films (films that get adhered as a cluster), generation of cracks or fractures of targets during sputtering, and absorption of large quantities of oxygen during the manufacturing process of sintering powder for targets. One reason for this is in the absorption of gas components such as large quantities of oxygen during the manufacture process of the target sintering powder.

The foregoing problems concerning the target or sputtering process are significant cause in deteriorating the quality of the thin film as the recording medium.

It is known that the foregoing problems are significantly influenced by the grain size of the sintering powder or the structure and quality of the target. Nevertheless, conventionally, since it was not possible to manufacture an appropriate amount of powder upon manufacturing an Sb—Te alloy sputtering target for forming a phase-change recording layer, and because there was no available manufacturing method capable of inhibiting these influences, it was not possible to avoid the generation of particles, abnormal electrical discharge, generation of nodules, and generation of cracks or fractures of the target during sputtering, or the inclusion of a large quantity of oxygen in the target.

As a conventional manufacturing method of a Ge—Sb—Te sputtering target, disclosed is a manufacturing method of a Ge—Sb—Te sputtering target including the steps of preparing powder by performing inert gas atomization to a Ge—Te alloy and an Sb—Te alloy, uniformly mixing the alloys having a ratio of Ge/Te=1/1 and Sb/Te=0.5 to 2.0, and thereafter performing pressure sintering thereto (for instance, refer to Patent Document 1).

Further, disclosed is a manufacturing method of a Ge—Sb—Te sputtering target and technology for manufacturing powder to be used therein employing the atomization method, including the steps of casting powder among the alloy powder containing Ge, Sb, Te in which the tap density (relative density) is 50% or greater into a mold, performing cold or hot pressurization thereto, and sintering the molding material in which the density after cold pressurization is 95% or greater through heat treatment in an Ar or vacuum atmosphere so as to make the oxygen content in the sintered compact 700 ppm or less (for instance, refer to Patent Document 2).

Further, disclosed is a manufacturing method of a Ge—Sb—Te sputtering target material including the steps of preparing rapidly-cooled powder by the inert gas atomization method from a raw material containing Ge, Sb, Te, and sintering a compact subject to cold or hot pressure forming using powder among said powder that is 20 μm or greater and having a particle size distribution where the specific surface area per unit weight is 300 $mm^2$/g or less (for instance, refer to Patent Document 3).

Other technologies for manufacturing targets using atomized powder are described in Patent Documents 4, 5, 6 indicated below.

Nevertheless, since the foregoing Patent Documents use the atomized powder as is, they are not able to obtain sufficient target strength, and it can hardly be said that they have achieved the refinement and homogenization of the target structure. Further, the tolerated oxygen content is high, and there is a problem in that the foregoing technologies are insufficient as an Sb—Te sputtering target for forming a phase-change recording layer.

Further, also known is a sputtering target for forming an optical disk recording layer in which the surface-oxidized layer and processing layer are removed, and having a surface roughness (center line average roughness) Ra≦1.0 μm (refer to Patent Document 7). The object of this target is to shorten the pre-sputter time and to eliminate pre-sputtering all together, and is extremely effect in achieving these objects.

Nevertheless, recent DVDs and BDs (Blu-Ray Discs) demand even high density, and the reduction of particles generated in the targets is extremely important in order to improve the production yield.

Thus, in addition to shortening the pre-sputter time as described above, it is necessary to improve the overall quality of the target, and not only the target surface, in order to effectively inhibit the generation of particles, abnormal discharge, generation of nodules, generation of cracks or fractures in the target and so on.

[Patent Document 1]
Japanese Patent Laid-Open Publication No. 2000-265262

[Patent Document 2]
Japanese Patent Laid-Open Publication No. 2001-98366

[Patent Document 3]
Japanese Patent Laid-Open Publication No. 2001-123266

[Patent Document 4]
Japanese Patent Laid-Open Publication No. S10-81962

[Patent Document 5]
Japanese Patent Laid-Open Publication No. 2001-123267

[Patent Document 6]
Japanese Patent Laid-Open Publication No. 2000-129316

[Patent Document 7]
Japanese Patent Laid-Open Publication No. 2000-169960

SUMMARY OF THE INVENTION

The present invention was devised in order to overcome the foregoing problems. Thus, an object of the present invention is to provide an Sb—Te alloy powder for sintering targets capable of effectively inhibiting the generation of particles, abnormal electrical discharge, general of nodules, and generation of cracks or fractures of the target during sputtering, and reducing gas components such as oxygen contained in the target. In particular, the present invention provides an Sb—Te alloy sintered compact sputtering target for forming a phase-change recording layer comprising an Ag—In—Sb—Te alloy or a Ge—Sb—Te alloy.

The present inventors discovered that a technical means for overcoming the foregoing problems is in the devisal of powder quality and target structure and characteristics in order to obtain a stable and homogenous phase-change recording layer.

Based on the foregoing discovery, the present invention provides:

1) An Sb—Te alloy sintered compact sputtering target having at least Sb or Te as its primary component, wherein surface roughness Ra is 0.4 µm or less, purity excluding gas components is 4N or more, content of gas components as impurities is 1500 ppm or less, and average crystal grain size is 50 µm or less. Here, an Sb—Te alloy refers to an alloy in which each amount of Sb or Te, or the total amount of Sb and Te is 50 at % or greater.
2) The Sb—Te alloy sintered compact sputtering target according to paragraph 1) above, wherein density of defects having a maximum length of 10 µm or greater arising in a surface finish by machining is 80 or less in an 800 µm square.
3) The Sb—Te alloy sintered compact sputtering target according to paragraph 1 or paragraph 2) above, wherein gas atomized powder is used as the raw material.
4) The Sb—Te alloy sintered compact sputtering target according to paragraph 3) above, wherein target surface roughness Ra is 0.1 µm or less.
5) The Sb—Te alloy sintered compact sputtering target according to any one of paragraphs 1) to 4) above containing one or more elements selected from Ag, In, Ga, Ti, Sn, Au, Pt and Pd at a maximum of 25 at %.

The Sb—Te alloy sintered compact is subject to cutting work and machining at the stage of finishing the target. With normal machining, however, strain such as numerous cracks is generated in the work-affected layer of the surface, and this strain causes the generation of particles. The present invention is able to considerably reduce the generation of nodules and particles that cause the foregoing cracks or fractures immediately after an operator starts using the target. Further, by improving the purity, it is possible to prevent abnormal electrical discharge (arcing) cased by impurities (oxides), and a significant effect is yielded in that it is possible to inhibit the generation of particles caused by arcing. Moreover, by reducing the size of the crystal grain size of the target, a superior effect is yielded in that it is possible to keep the eroded target surface smooth even after the erosion, and inhibit the generation of particles arising as a result of a redeposited film attaching to the surface ruggedness formed on the eroded surface, growing into nodules, and collapsing.

DETAILED DESCRIPTION OF THE INVENTION

Figure 1:
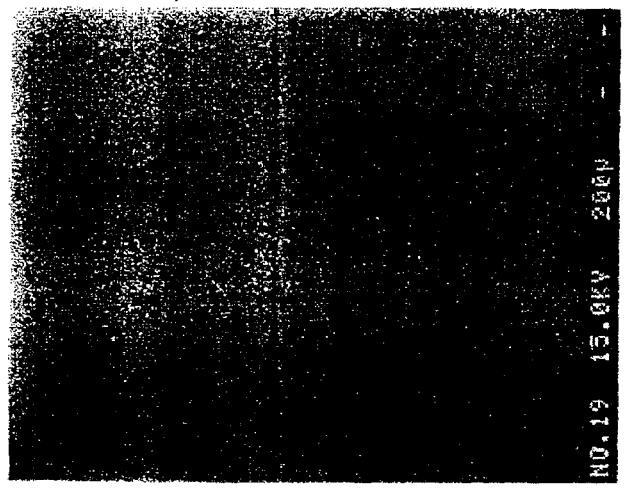
FIG. 1 is an SEM photograph of the target surface of Example 2.

The present invention obtains a sintered compact sputtering target by sintering Sb—Te alloy gas atomized powder or powder obtained through mechanical pulverization.

Generally speaking, with gas atomized powder, it is possible to obtain powder that is much finer than mechanical powder. In addition, since it is possible to prevent contamination caused by the use of a pulverizer, it could be said that it would be desirable to directly use gas atomized powder as sintering powder. A target sintered with the foregoing gas atomized powder can be processed to make the surface roughness Ra small at 0.1 µm or less. As described later, this is superior in terms of characteristics in comparison to machine-pulverized powder.

Nevertheless, there is no particular problem in using machine-pulverized powder so as long as it is able to satisfy the conditions of the present invention. Upon performing mechanical pulverization, it is desirable to perform this under an inert atmosphere in order to reduce the oxygen content. A vibratory ball mill or the like may be used in mechanical pulverization.

The Sb—Te alloy sintered compact sputtering target is characterized in that the surface roughness Ra is 0.4 µm or less, purity excluding gas components is 4N or more, content of gas components as impurities is 1500 ppm or less, and average crystal grain size is 50 µm or less. The target surface roughness has a strong influence on the existence of surface defects.

If the surface roughness is great, this implies that there is a surface defect including the work-affected layer under the surface. A surface defect including the work-affected layer will lead to the generation of numerous cracks. Although at a glance it may seem that the surface roughness and surface defect are not directly related, hidden surface defects exist in the surface roughness. By making the surface roughness Ra to be 0.4 µm or less, it is possible to nearly eliminate such surface defect including the work-affected layer from the target, and, thereby, it is possible to prevent the generation of cracks in the target and effectively inhibit the generation of particles caused by such cracks.

Further, by increasing the purity of the Sb—Te alloy sintered compact sputtering target, impurities other than the primary components and additive components; oxides for instance, will become the source of causing abnormal discharge (arcing). Since the present invention realized a purity level of 4N or higher, it is possible to effectively prevent arcing caused by such impurities, and inhibit the generation of particles caused by such arcing. Preferably, the purity level is 5N or higher.

The content of gas components as impurities needs to be 1500 ppm or less. The content of gas components such as oxygen, nitrogen, carbon and the like will cause the generation of impurities such as oxides, nitrides, carbides and the like, and the reducing of gas components will lead to the prevention of arcing, which in turn will lead to the generation of particles caused by such arcing.

Further, by reducing the size of the crystal grain size of the target, it is possible to keep the eroded target surface smooth even after the erosion, and inhibit the generation of particles arising as a result of a redeposited film attaching to the surface ruggedness formed on the eroded surface, growing into nodules, and collapsing.

By making the average crystal grain size to be 50 μm or less, it is possible to keep the eroded target surface smooth even after the erosion, and effectively inhibit the generation of particles arising as a result of a redeposited film attaching to the surface ruggedness formed on the eroded surface, growing into nodules, and collapsing.

Moreover, with the Sb—Te alloy sintered compact sputtering target of the present invention, it is desirable that the density of defects having a maximum length of 10 μm or greater arising in a surface finish by machining is 80 or less in an 800 μm square. Thereby, it is possible to prevent the growth of nodules caused by defects, and effectively inhibit the generation of particles arising as a result of such nodules collapsing.

As the additive elements of the Sb—Te alloy sintered compact sputtering target of the present invention, elements that will become ceramic when added to the Sb—Te alloy and capable of adopting the powder sintering method are selected; for instance, one or more elements selected from Ag, In, Ga, Ti, Sn, Au, Pt and Pd at a maximum of 25 at % to may be added. If the addition is within this range, it is possible to obtain the desired glass transition point and transformation speed, and simultaneously suppress to a minimum the surface defects caused by machining; whereby the generation of particles can be effectively inhibited.

Generally speaking, the eroded surface after sputtering becomes a rough surface where the surface roughness Ra is 1 μm or greater, and tends to become coarser together with the progress of sputtering. Nevertheless, the Sb—Te alloy sputtering target according to the present invention is extremely unique in that the eroded surface after sputtering can be maintained at a surface roughness Ra of 0.4 μm or less, and is capable of effectively inhibiting the generation of nodules and particles.

Accordingly, a phase-change target having a uniform and fine crystal structure, an additional effect is yielded in that the surface ruggedness caused by sputter erosion is reduced, and generation of particles caused by re-deposition peeling onto the target surface is reduced. Further, refinement of the structure yields advantages in that it is possible to inhibit the in-plane and lot-to-lot compositional variability of the sputtered film, and the quality of the phase-change recording layer will become stable. Then, it will be possible to reduce the generation of particles and abnormal electrical discharge during sputtering, and consequently inhibit the generation of nodules.

Further, with the Sb—Te sputtering target of the present invention, the content of gas component such as oxygen is made to be 1500 ppm or less, preferably 1000 ppm or less, and more preferably 500 ppm or less. The reduction of gas components such as oxygen enables the further reduction in the generation of particles and generation of abnormal discharge.

EXAMPLES

Examples of the present invention are now explained. Incidentally, these examples are merely illustrative, and the present invention shall in no way be limited thereby. In other words, the present invention shall include the various modes and modifications covered by the technical spirit of this invention.

Example 1

$Ag_5In_5Sb_{70}Te_{20}$ alloy raw material having a purity of 4N or higher was injected with a gas atomizer, argon gas (100 kgf/cm$^2$) as the injected gas, and temperature of 780° C. in order to manufacture atomized powder.

Fine spherical powder having an average grain size of 3 μm was obtained thereby. The oxygen content of this gas atomized powder was 150 ppm. The atomized powder was further hot pressed.

The obtained sintered compact was subject to machining and polishing in order to obtain a $Ag_5In_5Sb_{70}Te_{20}$ alloy target.

As a result, the target surface roughness Ra was 0.1 μm, purity excluding gas components was 4N, content of gas components as impurities was 220 wtppm, average crystal grain size was 3 μm, and 10 μm defect density was 3 defects/800 μm square. No generation of cracks could be acknowledged. The results are shown in Table 1.

Incidentally, in Table 1, the indication of "NA" in the column of "Oxygen Concentration of Gas Atomized Powder" shows that it was not subject to analysis since gas atomized powder was not used. Further, "Yes" is indicated when gas atomized powder was used, and "No" is indicated when gas atomized powder was not used. The same applied below.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 13 particles/wafer and 31 particles/wafer, respectively, and the number of nodules in the target was 40 nodules/target, and a superior target was obtained.

|  |  | Example 1 | Example 2 | Example 3 | Example 4 | Example 5 | Comparative Example 1 |
|---|---|---|---|---|---|---|---|
| Finish Processing |  | Polishing | Polishing | Polishing | Polishing | Polishing | Lathe |
| Ra | μm | 0.1 | 0.4 | 0.1 | 0.4 | 0.4 | 4.5 |
| Type |  | Ag—In—Sb—Te | Ag—In—Sb—Te | Ge—Sb—Te | Ge—Sb—Te | Ga—Sb | Ag—In—Sb—Te |
| Composition | at % | 5-5-70-20 | 5-5-70-20 | 22.2-22.2-55.6 | 22.2-22.2-55.6 | 20-80 | 5-5-70-20 |
| Purity |  | 4N | 4N | 4N5 | 5N | 4N | 4N |
| Gas Atomized Powder |  | Yes | No | Yes | No | No | No |
| Oxygen Concentration of Gas Atomized Powder | wtppm | 150 | NA | 250 | NA | NA | NA |
| Fill Powder Gas Component | wtppm | 220 | 900 | 320 | 870 | 400 | 900 |
| Crystal Grain Size | μm | 3 | 30 | 4 | 35 | 45 | 30 |
| 10 μm Defect Density | Defects/800 μm□ | 3 | 26 | 3 | 30 | 71 | Uncountable |

-continued

|  |  |  |  |  |  |  |
|---|---|---|---|---|---|---|
| Ave. Particle Count up to 10 kWh | Particles/Wafer | 13 | 18 | 12 | 17 | 21 | 150 |
| Ave. Particle Count up to 100 kWh | Particles/Wafer | 31 | 40 | 21 | 30 | 31 | 102 |
| Number of Nodules | Nodules/Target | 40 | 52 | 30 | 45 | 25 | ≧300 |

|  |  | Comparative Example 2 | Comparative Example 3 | Comparative Example 4 | Comparative Example 5 | Comparative Example 6 |
|---|---|---|---|---|---|---|
| Finish Processing |  | Polishing | Polishing | Lathe | Lathe | Grinding |
| Ra | μm | 0.4 | 0.4 | 3.5 | 4.4 | 0.2 |
| Type |  | Ag—In—Sb—Te | Ag—In—Sb—Te | Ge—Sb—Te | Ge—Sb—Te | Ag—In—Sb—Te |
| Composition | at % | 5-5-70-20 | 5-5-70-20 | 22.2-22.2-55.6 | 22.2-22.2-55.6 | 5-5-70-20 |
| Purity |  | 3N | 4N | 4N5 | 5N | 4N |
| Gas Atomized Powder |  | No | No | Yes | No | No |
| Oxygen Concentration of Gas Atomized Powder | wtppm | NA | NA | 250 | NA | NA |
| Fill Powder Gas Component | wtppm | 1800 | 900 | 320 | 870 | 900 |
| Crystal Grain Size | μm | 42 | 70 | 4 | 35 | 30 |
| 10 μm Defect Density | Defects/800 μm□ | 30 | 78 | Uncountable | Uncountable | 250 |
| Ave. Particle Count up to 10 kWh | Particles/Wafer | 21 | 30 | 128 | 130 | 80 |
| Ave. Particle Count up to 100 kWh | Particles/Wafer | 70 | 90 | 66 | 60 | 70 |
| Number of Nodules | Nodules/Target | 250 | ≧300 | 230 | 200 | ≧300 |

Example 2

Powder raw materials of Ag, In, Sb and Te respectively having a purity level of 4N or higher excluding gas components were mixed and synthesized to become a $Ag_5In_5Sb_{70}Te_{20}$ alloy, and this was subject to mechanical pulverization in an inert atmosphere. Thereby, powder having an average grain size of 30 μm was obtained. Further, this powder was hot pressed. The obtained sintered compact was subject to machining and polishing to obtain a $Ag_5In_5Sb_{70}Te_{20}$ alloy target.

As a result, the target surface roughness Ra was 0.4 μm, purity excluding gas components was 4N, content of gas components as impurities was 900 wtppm, average crystal grain size was 30 μm, and 10 μm defect density was 26 defects/800 μm square. No generation of cracks could be acknowledged. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 18 particles/wafer and 40 particles/wafer, respectively, and the number of nodules in the target was 52 nodules/target, and a superior target was obtained.

Example 3

$Ge_{22.2}Sb_{22.2}Te_{55.6}$ alloy raw material was injected with a gas atomizer, argon gas (100 kgf/cm$^2$) as the injected gas, and temperature of 780° C. in order to manufacture atomized powder.

Fine spherical powder was obtained thereby. The oxygen content of this gas atomized powder was 250 ppm. The atomized powder was further hot pressed.

The obtained sintered compact was subject to machining and polishing in order to obtain a $Ge_{22.2}Sb_{22.2}Te_{55.6}$ alloy target.

As a result, the target surface roughness Ra was 0.1 μm, purity excluding gas components was 4N5, content of gas components as impurities was 320 wtppm, average crystal grain size was 4 μm, and 10 μm defect density was 3 defects/800 μm square. The results are shown in Table 1. Further, the SEM photograph of this obtained target surface is shown in FIG. 1. As shown in FIG. 1, the generation of cracks could hardly be acknowledged.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 12 particles/wafer and 21 particles/wafer, respectively, and the number of nodules in the target was 30 nodules/target, and a superior target was obtained.

Example 4

Powder raw materials of Ge, Sb and Te respectively having a purity level of 5N or higher excluding gas components were mixed and synthesized to become a $Ge_{22.2}Sb_{22.2}Te_{55.6}$ alloy, and this was subject to mechanical pulverization in an inert atmosphere. Thereby, fine spherical powder having an average grain size of 4 μm was obtained.

Further, this powder was hot pressed. The obtained sintered compact was subject to machining and polishing to obtain a $Ge_{22.2}Sb_{22.2}Te_{55.6}$ alloy target.

As a result, the target surface roughness Ra was 0.4 μm, purity excluding gas components was 5N, content of gas components as impurities was 870 wtppm, average crystal grain size was 35 μm, and 10 μm defect density was 30 defects/800 μm square. No generation of cracks could be acknowledged. The results are shown in Table 1.

Figure 2:
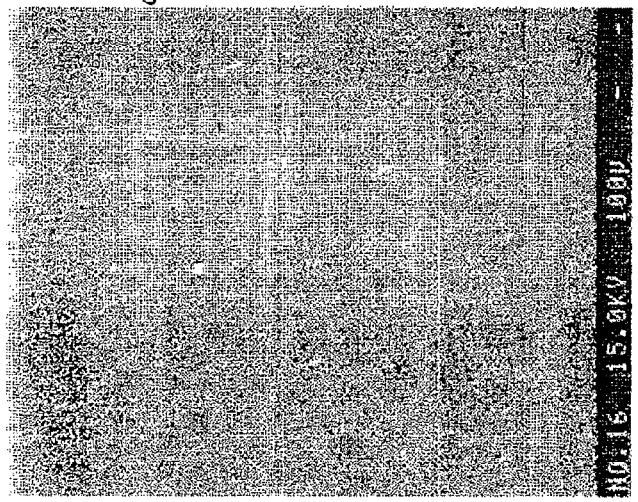
FIG. 2 is an SEM photograph of the target surface of Example 3.
Figure 3:
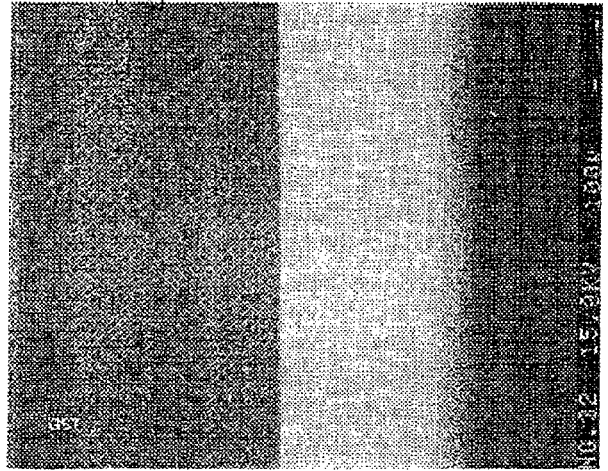
FIG. 3 is an SEM photograph of the target cross section of Example 3.

The SEM photograph of the obtained target surface is shown in FIG. 2. In FIG. 2, although some defects (white dots in FIG. 2) can be acknowledged, the amount thereof was small at 30 defects/800 μm square. The SEM photograph of the target cross section is shown in FIG. 3. As shown in FIG. 3, hardly any surface defects could be acknowledged.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 17 particles/wafer and 30 particles/wafer, respectively, and the number of nodules in the target was 45 nodules/target, and a superior target was obtained.

Example 5

Powder raw materials of Ga and Sb respectively having a purity level of 5N or higher excluding gas components were mixed and synthesized to become a $Ga_{20}Sb_{80}$ alloy, and this was subject to mechanical pulverization in an inert atmosphere. Thereby, powder having an average grain size of 30 µm was obtained.

Further, this powder was hot pressed. The obtained sintered compact was subject to machining and polishing to obtain a $Ga_{20}Sb_{80}$ alloy target.

As a result, the target surface roughness Ra was 0.4 µm, purity excluding gas components was 4N, content of gas components as impurities was 400 wtppm, average crystal grain size was 45 µm, and 10 µm defect density was 71 defects/800 µm square. No generation of cracks could be acknowledged. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 21 particles/wafer and 31 particles/wafer, respectively, and the number of nodules in the target was 25 nodules/target, and a superior target was obtained.

Comparative Example 1

Powder raw materials of Ag, In, Sb and Te respectively having a purity level of 5N or higher excluding gas components were mixed and synthesized to become a $Ag_5In_5Sb_{70}Te_{20}$ alloy, and this was subject to mechanical pulverization in an inert atmosphere. Thereby, powder having an average grain size of 30 µm was obtained. Further, this powder was hot pressed. The obtained sintered compact was subject to machining (lathe work) to obtain a $Ag_5In_5Sb_{70}Te_{20}$ alloy target.

As a result, the target surface roughness Ra was 4.5 µm (a significant deviation from the present invention), purity excluding gas components was 4N, content of gas components as impurities was 900 wtppm, average crystal grain size was 30 µm, and 10 µm defect density was uncountable. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 150 particles/wafer and 102 particles/wafer, respectively, and the number of nodules in the target was 300 nodules or more/target, and an inferior target as with conventional cases was obtained.

Comparative Example 2

Powder raw materials of Ag, In, Sb and Te respectively having a purity level of 3N or higher excluding gas components were mixed and synthesized to become a $Ag_5In_5Sb_{70}Te_{20}$ alloy, and this was subject to mechanical pulverization in an inert atmosphere. Thereby, powder having an average grain size of 42 µm was obtained. Further, this powder was hot pressed. The obtained sintered compact was subject to machining and polishing to obtain a $Ag_5In_5Sb_{70}Te_{20}$ alloy target.

As a result, the target surface roughness Ra was 0.4 µm, purity excluding gas components was 3N, content of gas components as impurities was 1800 wtppm, average crystal grain size was 42 µm, and 10 µm defect density was 30 defects/800 µm square. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 21 particles/wafer and 70 particles/wafer, respectively, and the number of nodules in the target was 250 nodules/target, and an inferior target as with conventional cases was obtained.

Comparative Example 3

Powder raw materials of Ag, In, Sb and Te respectively having a purity level of 5N or higher excluding gas components were mixed and synthesized to become a $Ag_5In_5Sb_{70}Te_{20}$ alloy, and this was subject to mechanical pulverization. Thereby, powder having an average grain size of 70 µm was obtained. Further, this powder was hot pressed. The obtained sintered compact was subject to machining and polishing to obtain a $Ag_5In_5Sb_{70}Te_{20}$ alloy target.

As a result, the target surface roughness Ra was 0.4 µm, purity excluding gas components was 4N, content of gas components as impurities was 900 wtppm, average crystal grain size was 70 µm, and 10 µm defect density was 78 defects/800 µm square. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 30 particles/wafer and 90 particles/wafer, respectively, and the number of nodules in the target was 300 nodules or more/target, and an inferior target as with conventional cases was obtained.

Comparative Example 4

$Ge_{22.2}Sb_{22.2}Te_{55.6}$ alloy raw material was injected with a gas atomizer, argon gas (100 kgf/cm$^2$) as the injected gas, and temperature of 780° C. in order to manufacture atomized powder. The atomized powder was further hot pressed. The obtained sintered compact was subject to machining (lathe work) in order to obtain a $Ge_{22.2}Sb_{22.2}Te_{55.6}$ alloy target.

Figure 4:
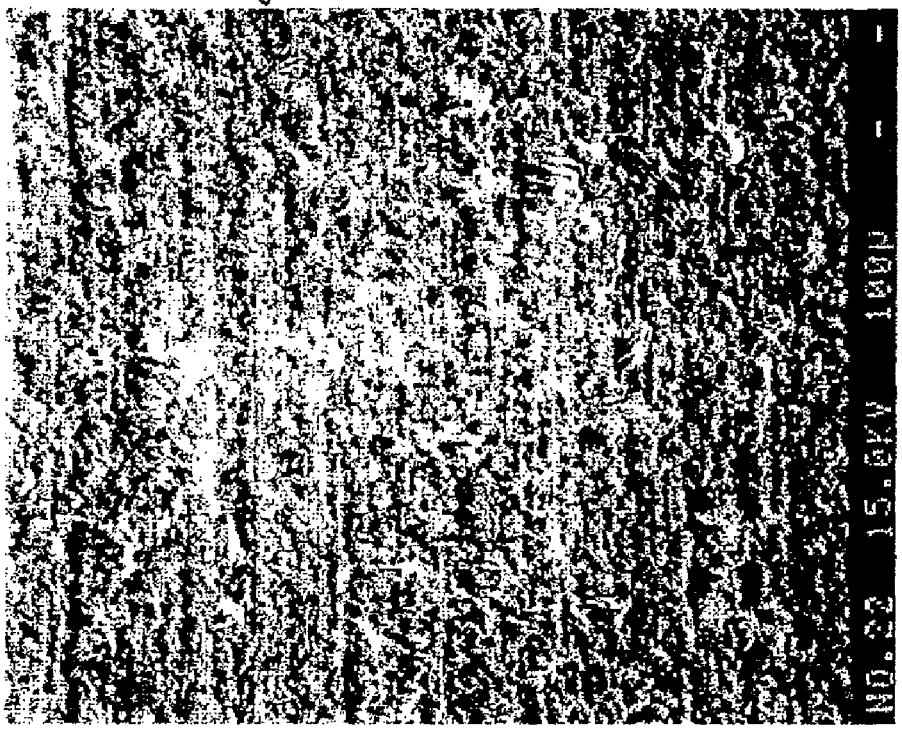
FIG. 4 is an SEM photograph of the target surface of Comparative Example 4.

As a result, the target surface roughness Ra was 3.5 μm, purity excluding gas components was 4N5, content of gas components as impurities was 320 wtppm, average crystal grain size was 4 μm, and 10 μm defect density was uncountable. The SEM photograph of the target surface is shown in FIG. 4. As shown in FIG. 4, numerous cracks could be acknowledged. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 128 particles/wafer and 66 particles/wafer, respectively, and the number of nodules in the target was 230 nodules/target, and an inferior target as with conventional cases was obtained.

Comparative Example 5

Powder raw materials of Ge, Sb and Te respectively having a purity level of 5N or higher excluding gas components were mixed and synthesized to become a $Ge_{22.2}Sb_{22.2}Te_{55.6}$ alloy, and this was subject to mechanical pulverization. Thereby, powder having an average grain size of 70 μm was obtained. Further, this powder was hot pressed. The obtained sintered compact was subject to machining (lathe work) to obtain a $Ge_{22.2}Sb_{22.2}Te_{55.6}$ alloy target.

Figure 5:
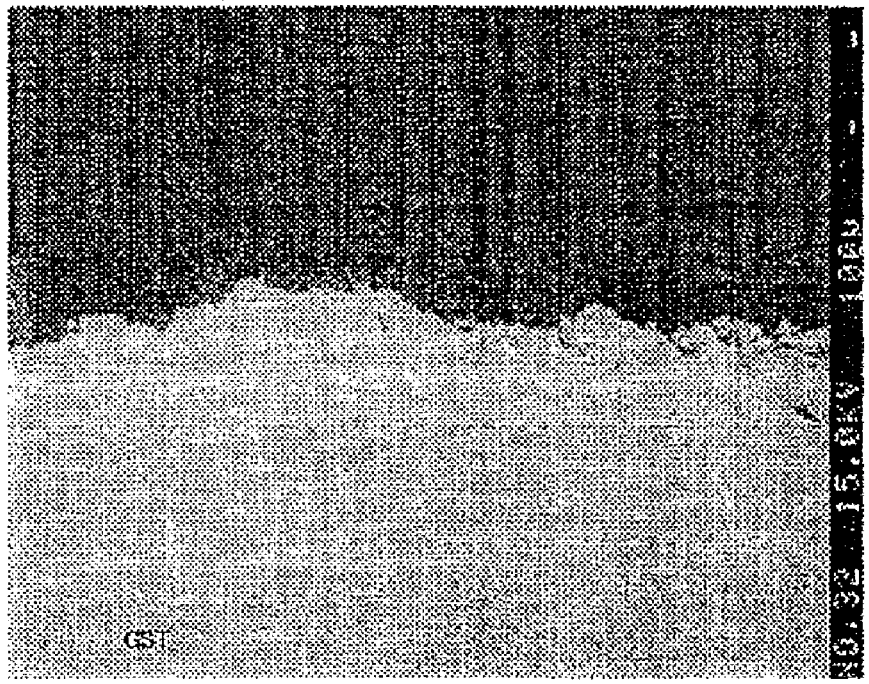
FIG. 5 is an SEM photograph of the target cross section of Comparative Example 5.

As a result, the target surface roughness Ra was 4.4 μm, purity excluding gas components was 5N, content of gas components as impurities was 870 wtppm, average crystal grain size was 35 μm, and 10 μm defect density was uncountable. The SEM photograph of the target cross section is shown in FIG. 5. As shown in FIG. 5, the work-affected layer of the target cross section exists in a wide range up to a depth of 100 μm or deeper. The results are shown in Table 1.

Sputtering was performed using this target. The result was no generation of arcing, and the number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 130 particles/wafer and 80 particles/wafer, respectively, and the number of nodules in the target was 200 nodules or more/target, and an inferior target as with conventional cases was obtained.

Comparative Example 6

Powder raw materials of Ag, In, Sb and Te respectively having a purity level of 4N or higher excluding gas components were mixed and synthesized to become a $Ag_5In_5Sb_{70}Te_{20}$ alloy, and this was subject to mechanical pulverization in an inert atmosphere. Thereby, powder having an average grain size of 30 μm was obtained. Further, this powder was hot pressed. The obtained sintered compact was subject to machining and lathe work to obtain a $Ag_5In_5Sb_{70}Te_{20}$ alloy target. Numerous cracks were acknowledged in the target.

As a result, the target surface roughness Ra was 0.2 μm, purity excluding gas components was 4N, content of gas components as impurities was 900 wtppm, average crystal grain size was 30 μm, and 10 μm defect density was 250 defects/800 μm square.

Sputtering was performed using this target. The number of generated particles and the number of generated nodules when sputtering was performed up to 10 kWhr and 100 kWhr are similarly shown in Table 1.

As shown in Table 1, the number of generated particles when sputtering was performed up to 10 kWhr and up to 100 kWhr was 160 particles/wafer and 135 particles/wafer, respectively, and the number of nodules in the target was 300 nodules or more/target, and a significantly inferior target was obtained.

The Sb—Te alloy sintered compact is able to considerably reduce the generation of nodules and particles that cause the foregoing cracks or fractures immediately after an operator starts using the target. Further, by improving the purity, it is possible to prevent abnormal electrical discharge (arcing) cased by impurities (oxides), and a significant effect is yielded in that it is possible to inhibit the generation of particles caused by arcing. Moreover, by reducing the size of the crystal grain size of the target, a superior effect is yielded in that it is possible to keep the eroded target surface smooth even after the erosion, and inhibit the generation of particles arising as a result of a redeposited film attaching to the surface ruggedness formed on the eroded surface, growing into nodules, and collapsing. Thus, the present invention is extremely useful as a phase-change recording material; that is, a medium for recording information using a phase-change.

The invention claimed is:

1. An Sb—Te alloy sintered compact sputtering target having at least Sb or Te as its primary component, wherein surface roughness Ra is 0.4 μm or less, purity excluding gas components is 4N or more, content of gas components as impurities is 1500 ppm or less, average crystal grain size is 50 μm or less, and a density of defects having a maximum length of 10 μm or greater arising in a surface finish by machining is 80 or less in an 800 μm square.

2. The Sb—Te alloy sintered compact sputtering target according to claim 1 containing one or more elements selected from Ag, In, Ga, Ti, Sn, Au, Pt and Pd at a maximum of 25 at %.

3. The Sb—Te alloy sintered compact sputtering target according to claim 1, wherein a raw material from which the Sb—Te alloy sintered compact sputtering target is made is gas atomized powder.

4. The Sb—Te alloy sintered compact sputtering target according to claim 3, wherein said surface roughness Ra is 0.1 μm or less.

5. The Sb—Te alloy sintered compact sputtering target according to claim 4, wherein said target contains one or more elements selected from Ag, In, Ga, Ti, Sn, Au, Pt and Pd at a maximum of 25 at %.

6. The Sb—Te alloy sintered compact sputtering target according to claim 1, wherein the sintered compact consists of an Ag—In—Sb—Te alloy.

7. The Sb—Te alloy sintered compact sputtering target according to claim 6, wherein the Ag—In—Sb—Te alloy is $Ag_5In_5Sb_{70}Te_{20}$.

8. The Sb—Te alloy sintered compact sputtering target according to claim 1, wherein the sintered compact consists of a Ge—Sb—Te alloy.

9. The Sb—Te alloy sintered compact sputtering target according to claim 8, wherein the Ge—Sb—Te alloy is $Ge_{22.2}Sb_{22.2}Te_{55.6}$.

10. The Sb—Te alloy sintered compact sputtering target according to claim 1, wherein the content of gas components as impurities is 1000 ppm or less.

11. The Sb—Te alloy sintered compact sputtering target according to claim 1, wherein the content of gas components as impurities is 500 ppm or less.

12. The Sb—Te alloy sintered compact sputtering target according to claim 1, wherein said surface roughness Ra of 0.4 μm or less is a surface roughness of a sputtering face of said sputtering target before said sputtering face is subjected to erosion by a sputtering operation, and wherein said sintered compact has a structure that enables said sputtering face to maintain said surface roughness Ra of 0.4 μm or less after said sputtering face is subject to erosion by a sputtering operation.

* * * * *